United States Patent [19]

Berteaud et al.

[11] Patent Number: 4,585,699
[45] Date of Patent: Apr. 29, 1986

[54] METHOD OF APPLYING MICROWAVE ENERGY TO HEAT TREATING COATINGS ON DIELECTRIC SUPPORTS, IN PARTICULAR ELECTRICALLY CONDUCTIVE COATINGS, AND PRODUCTS OBTAINED BY THE METHOD

[75] Inventors: André-Jean Berteaud, Draveil; René Clement, Brunoy; Alain Germain, Bagneux, all of France

[73] Assignee: Centre National de la Recherche Scientifique (CNRS), Paris, France

[21] Appl. No.: 651,834

[22] Filed: Sep. 18, 1984

[30] Foreign Application Priority Data

Sep. 21, 1983 [FR] France ................ 83 14989

[51] Int. Cl.⁴ .................. B05D 3/02; B05D 5/12; B32B 15/08; B32B 27/38
[52] U.S. Cl. .................. 428/418; 427/45.1; 427/123; 427/209; 427/210; 428/433; 428/434
[58] Field of Search .............. 427/45.1, 209, 210, 427/123, 125; 428/418, 433, 434

[56] References Cited

U.S. PATENT DOCUMENTS 3,705,819 12/1972 Heller et al. ............... 427/45.1
3,748,204 7/1973 Murayama et al. .......... 427/45.1 X

FOREIGN PATENT DOCUMENTS 1473832 2/1967 France .
2458323 1/1981 France .

Primary Examiner—Michael R. Lusignan
Attorney, Agent, or Firm—Blakely, Sokoloff, Taylor & Zafman

[57] ABSTRACT

The method comprises the following steps: depositing the coating (20) to be treated on a first face (11) of the dielectric support (10); depositing a layer (30) of electrically conductive material on a second face (12) of the dielectric support (10) opposite to the first face and generally parallel thereto, the thickness of said layer (30) being of the same order as the penetration depth δ in the material thereof of the selected electromagnetic wave; and applying microwave energy to the assembly thus constituted in such a manner that the direction of vibration of the electric field is substantially parallel to the coating (20) to be treated and to the layer (30) of conductive material.

10 Claims, 2 Drawing Figures

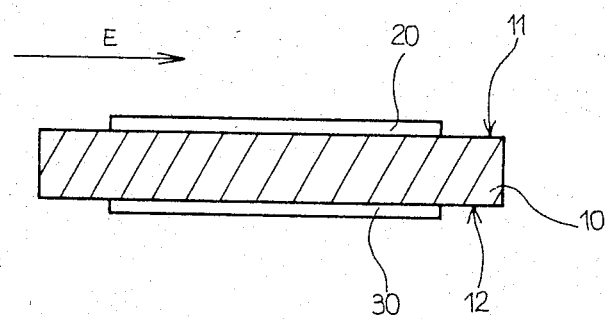
FIG_1
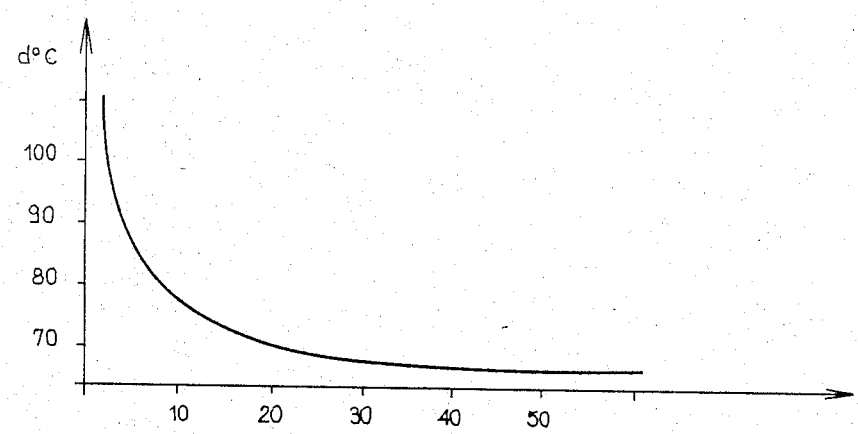
FIG_2

METHOD OF APPLYING MICROWAVE ENERGY TO HEAT TREATING COATINGS ON DIELECTRIC SUPPORTS, IN PARTICULAR ELECTRICALLY CONDUCTIVE COATINGS, AND PRODUCTS OBTAINED BY THE METHOD

The present invention relates to a method of heat treatment in which microwave energy is applied to coatings deposited on dielectric supports.

The present invention relates more particularly to a method of applying microwave energy to heat treating coatings which are impregnated with electrically conductive material.

The method of the present invention is particularly, but not exclusively, applicable to reticulating heat polymerizable inks impregnated with electrically conductive material.

BACKGROUND OF THE INVENTION

Proposals have already been made for using microwave energy to reticulate polymers that contain polar constituents.

Such microwave heat treatment methods have the particular advantages of requiring a relatively short treatment time (generally a few minutes), of high energy efficiency, and of an average forming temperature which is lower than that obtained using conventional heat treatment methods.

In particular, French published patent specification number 2 458 323 describes a method and an apparatus for using microwaves to treat coatings on substrates.

Further, it is known that material is reticulated particularly efficiently by microwaves when the material is in thin layer form, thereby obtaining a "filmogen" type binder.

However, it turns out in practice that the methods of applying microwave energy proposed up to now are very poorly adapted to processing certain materials.

This is particularly true of coatings having a high concentration of electrically conductive material therein.

It is recalled that if microwaves are applied to thick material of high conductivity, the material is generally not heated since these very properties of the material impose an electric field which is either zero or else orthogonal to the surface of the material.

In contrast, when the thickness of the conductive material is of the same order as the thickness of the skin effect (generally denoted as the "penetration depth $\delta$"), and if the charge density is high, the material heats very fast and may even burn in a few seconds at a critical very high density.

In particular, iridescence may appear on the conductive material if the heat generated cannot be removed quickly enough by exchange with the support or with air.

It is recalled that the tangential component of the electric field falls off exponentially in a conductor in the vicinity of its surface, and that the term "penetration depth $\delta$" or "skin effect thickness" are used to designate the depth at which the electric field is reduced to $1/2.718$ (ie. $1/e$) of the initial value of the field at the surface of the conductor.

In parcticular, tests on an ink comprising a polymerizable binder such as alkyd melamine resin with conductive particles of carbon or of a metal such as copper or aluminum embedded therein, have shown that when a film of the ink is deposited on a dielectric support which is placed parallel to the electric field, the film may be destroyed before the binder has had time to polymerize.

This is due to the fact that in conductive materials which are of the same order of thickness as the skin effect depth, the average of the tangential component of the electric field is no longer negligible, thus greatly increasing the heating effect which is proportional to the square of the electric field as well as to the conductivity of the material.

Further, reducing the heating of the material to be treated merely by reducing the intensity of the electric field applied to the dielectric support on which the material is coated, or by reducing the power of the propagated wave, is not acceptable either. This tactic has the accompanying drawback of also reducing the heating of dielectric support, which is generally to be avoided since that may lead to poor adherence of the material on the support due to the support remaining cold during the heat treatment.

It is for these reasons that conventional techniques still have to be used for the heat treatment of various materials, and in particular coatings of high conductivity, in spite of the numerous advantages which can otherwise be obtained by using microwaves for the heat treatment of materials, and in particular surface coatings.

Preferred implementations of the present invention provide a new method of applying microwave energy to a coating deposited on a dielectric support, which method enables a material such as an electrically conductive ink to adhere satisfactorily to the support without deteriorating the material itself.

SUMMARY OF THE INVENTION

To achieve this result, the Applicants have discovered that it is desirable to maintain a fairly high electric field on the support, while reducing the electric field applied to the coating deposited on the support.

It should be noted, however, that although the method in accordance with the invention is particularly applicable, as described above, to the heat treatment of coatings having a high degree of conductive material therein, it is nonetheless applicable more generally to any case in which it is desired to increase the heating effect applied to a dielectric support relative to the heating effect applied to a coating to be treated, and in comparison with conventional methods of using microwaves for the heat treatment of a coating deposited on a dielectric support.

The method in accordance with the invention consists in:

(1) depositing the coating to be treated on a first face of the dielectric support;
(2) depositing a layer of electrically conductive material on a second face of the dielectric support opposite to the first face and generally parallel thereto, the thickness of said layer being of the same order as the penetration depth $\delta$ in the material thereof of the selected electromagnetic wave; and
(3) applying microwave energy to the assembly thus constituted in such a manner that the direction of vibration of the electric field is substantially parallel to the coating to be treated and to the layer of conductive material.

The term "of the same order as the penetration depth $\delta$" of the electromagnetic wave is used to designate a thickness which is not more than a few times δ, and more precisely which is not greater than about 10δ.

The effects obtained by adding a layer of electrically conductive material on the second face of the dielectric support are explained below.

Naturally, the present patent application also extends to products obtained by performing the above-defined method.

BRIEF DESCRIPTION OF THE DRAWINGS

An implementation of the invention is described by way of example with reference to the accompanying drawing, in which:

FIG. 1 is a section through a dielectric support having a coating for heat treatment on a first face and a layer of electrically conductive material on a second face, ready for use in the method of the present invention; and FIG. 2 is a graph showing the variation in the temperature of the dielectric support as a function of the thickness of the electrically conductive layer applied to the second face of the support, in a particular implementation of the method in accordance with the invention.

MORE DETAILED DESCRIPTION

The following detailed description relates to the heat treatment of coatings having conductive particles embedded therein. However, this is not to be taken as being a limitation on the present invention which is capable of being used in other applications.

As shown in FIG. 1, the heat treatment method in accordance with the invention consists initially in depositing a coating 20 to be treated on a first main face 11 of a dielectric support 10. The coating in this example has electrically conductive material embedded therein. A layer of electrically conductive material 30 is also deposited on a second main face 12 of the dielectric support 10.

More precisely, the second face 12 of the dielectric support is opposite the first face 11 and is generally parallel thereto.

The first and second faces 11 and 12 are preferably plane. However, it should be noted that the present invention can be applied to a dielectric support having curved main faces, provided that the faces are curved in a manner that enables microwave energy to be applied such that the direction of vibration of the electric field is substantially parallel to the coating 20 and to the layer 30.

The order in which the coating 20 to be heat treated and the electrically conductive layer 30 are applied to the dielectric support 10 is of little importance. However, it is desirable to verify that the thicknesses of the coating to be treated 20 and the layer of electrically conductive material 30 are of the same order as the penetration depth of the selected electromagnetic wave in the respective materials. The term "same order as the penetration depth" is defined above.

Various techniques may be used to deposit the layer of conductive material 30 on the second face of the dielectric support 10.

The following techniques are mentioned as non-limiting examples:
(1) directly coating an electrically conductive ink;
(2) depositing a metal; and
(3) gluing a metal film.

The layer 30 may also be deposited simply by placing the second face 12 of the dielectric support 10 on a metal member.

The Applicants have obtained excellent results by placing the support 10 on a metal cradle having a thickness of a few microns and having curved edges for avoiding discharges when microwave energy is subsequently applied thereo.

It is also possible to directly metallize various portions of a conveyor belt and to place the support 10 together with its coating 20 to be treated on the metallized portions of the belt which then serve as the electrically conductive layer 30.

The assembly thus formed constituted by a dielectric support 10 covered on one side by a coating 20 to be treated and on the other side by a layer 30 of electrically conductive material is then subjected to the application of microwave energy.

The energy is applied in such a manner that the direction of vibration of the electric field is substantially parallel to the coating 20 and to the layer 30 of electrically conductive material, as indicated by an arrow E in FIG. 1.

To do this, the above-mentioned assembly may be placed in the plane of symmetry of a waveguide in a position of maximum electric field.

The microwave energy may, however, be generated in numerous ways for the implementation of the present invention. Such arrangements are well known to the person skilled in the art and are not described further.

The addition of a layer of electrically conductive material to the second face of the dielectric support serves two functions.

Firstly, the intensity of the electric field is reinforced in the plane of the second face (with the layer of electrically conductive material) to the detriment of the first face (with the coating to be treated). Thus the support is heated more rapidly by dielectric loss and the coating is treated at reduced speed.

Secondly, the intensified electric field applied to the second face of the support heats the layer of electrically conductive material by conduction losses, and the heat produced in this way is transmitted to the dielectric support.

Finally, in order to determine the increase in heating of the dielectric support 10 obtained by applying a metal layer 30 on the second face 12 of the support, the Applicants have measured the temperature reached by a glass-paper-epoxy support under the effect of microwaves. The support was 0.9 mm thick and its surface 12 opposite to the surface receiving the coating 20 to be treated was placed on a silver washer having a diameter of 26 mm.

The tests were performed with an applied power of about 1 kW at a frequency of 2.45 GHz.

More particularly, the tests were performed using silver washers of various thicknesses in order to measure the influence of washer thickness of support heating.

The results obtained are plotted in FIG. 2.

This figure clearly demonstrates that the metallization (the silver washer) plays a major role in the heating of the dielectric support so long as its thickness is less than 20 microns, ie. less than a few times the penetration depth δ which is about 2 to 3 microns in this case.

Since the component of the electric field tends exponentially to zero in the thickness of the skin effect, the average electric field obtained beyond the above-mentioned thickness likewise tends to zero, and thus the heating effect on the electrically conductive layer 30 is substantially zero.

The energy lost in the conductive material is proportional to:

$$\sigma.E^2$$

where $\sigma$ represents the conductivity of the material and E corresponds to the average value of the electric field.

It will also be noted that it is easy to accurately adjust the speed at which the coating 20 deposited on the first face 11 of the support 10 is treated, by choosing a suitable thickness for the conductive layer 30.

The residual heating of the dielectric layer 10 obtained for metallization thicknesses greater than 30 microns is due to dielectric losses internal to the support since the heating effect on the metallization by conduction losses is negligible.

The Applicants have also performed reticulation tests on heat polymerizable "conductive" inks haing silver embedded therein and silk screen printed on the first face 11 of a glass-epoxy dielectric support whose second face 12 was covered with a copper layer of 8 to 35 microns' thickness.

The speed of reticulation of the conductive ink was easily controllable so that the material was properly reticulated in a period of 7 to 10 minutes.

To reticulate similar products in conventional ovens, a heat treatment period of about 5 hours was required.

Tests on implementations of the method in accordance with the invention have made it possible to obtain products constituted by a dielectric support coated with material having an electrical resistance of about 50 milliohms per square of 25 $\mu$m thickness. It is recalled that the electrical conductivity characteristic of a silk screen printed conductive or resistive coating may be expressed ohms per square for a coating of constant thickness (eg. 25 $\mu$m), and that the electrical resistance of such a square is proportional to the resistivity of the material, regardless of the area of the coating. This characteristic is well known to the person skilled in the art.

Such results show that the method of using microwaves to heat treat electrically conductive coatings on dielectric supports which are metallized on the opposite surface prior to heat treatment can be used in many applications, in particular in the composite electronic component industry, eg. for keyboard manufacture.

Other tests have been performed on coatings based on inks containing carbon particles having a resistance at rest of about 100 ohms per square of 25 $\mu$m thickness. Reticulation times are about 10 to 15 minutes depending on the carbon content and on the microwave power used.

It may also be noted that after heat treatment by application of microwave energy, the layer of metallization deposited on the second face 12 of the support may be removed, for example to enable other materials to be subsequently deposited thereon.

Advantageously, the frequency range of microwaves used lies between about 0.1 GHz and about 100 GHz, and is preferably about 0.5 GHz to about 30 GHz, with a penetration depth of these microwaves in metals being a few microns.

We claim:

1. A method of heat treating a coating deposited on a dielectric support, by the application of microwave energy, the method comprising the following steps:
   (1) depositing the coating to be treated on a first face of the dielectric support;
   (2) depositing a layer of electrically conductive material on a second face of the dielectric support opposite to the first face and generally parallel thereto, the thickness of said layer being not greater than 10 $\delta$, where $\delta$ is the penetration depth in the material thereof of the selected electromagnetic wave; and
   (3) applying microwave energy to the assembly thus constituted in such a manner that the direction of vibration of the electric field is substantially parallel to the coating to be treated and to the layer of conductive material.

2. A heat treatment method according to claim 1, wherein the coating to be treated includes electrically conductive material.

3. A heat treatment method according to claim 2, wherein the thickness of the coating to be treated is of the same order as the penetration depth $\delta$ therein of the selected electromagnetic radiation.

4. A heat treatment method according to claim 1, wherein the electrically conductive material deposited in step (2) is a metal.

5. A heat treatment method according to claim 1, wherein the electrically conductive layer is deposited in step (2) by depositing an electrically conductive ink on the second face of the dielectric support.

6. A heat treatment method according to claim 1, wherein the electrically conductive layer is deposited in step (2) by depositing metal on the second face of the dielectric support.

7. A heat treatment method according to claim 1, wherein the electrically conductive layer is deposited in step (2) by gluing a metal film on the second face of the dielectric support.

8. A heat treatment method according to claim 1, wherein the electrically conductive layer is deposited in step (2) by placing the second face of the dielectric support on a metal member.

9. A heat treatment method according to claim 1, wherein the coating deposited in step (1) is a heat polymerizable ink containing metal or carbon particles.

10. A product obtained by performing the method of claim 1.

* * * * *

UNITED STATES PATENT AND TRADEMARK OFFICE
CERTIFICATE OF CORRECTION

PATENT NO. : 4,585,699
DATED : Apr. 29, 1986
INVENTOR(S) : Berteaud et al.

It is certified that error appears in the above-identified patent and that said Letters Patent is hereby corrected as shown below:

| COLUMN | LINE | DESCRIPTION |
| --- | --- | --- |
| 4 | 8 | Please delete "thereo" and insert --thereto--. |
| 5 | 19 | Please delete "haing" and insert --having--. |

Signed and Sealed this

Tenth Day of March, 1987

*Attest:*

DONALD J. QUIGG

*Attesting Officer*     *Commissioner of Patents and Trademarks*